(12) United States Patent
Daly et al.

(10) Patent No.: US 10,205,033 B1
(45) Date of Patent: Feb. 12, 2019

(54) ESD PROTECTED SEMICONDUCTOR PHOTOMULTIPLIER

(71) Applicant: SensL Technologies Ltd., County Cork (IE)

(72) Inventors: Paul Malachy Daly, Ballincollig (IE); John Carlton Jackson, Cobh (IE); Brian McGarvey, Templemartin (IE); Stephen Bellis, Cobh (IE)

(73) Assignee: SensL Technologies Ltd., County Cork (IE)

( * ) Notice: Subject to any disclaimer, the term of this patent is extended or adjusted under 35 U.S.C. 154(b) by 0 days.

(21) Appl. No.: 15/841,895

(22) Filed: Dec. 14, 2017

(51) Int. Cl.
| | | |
|---|---|---|
| *H01L 31/02* | (2006.01) | |
| *H01L 27/02* | (2006.01) | |
| *H01L 27/144* | (2006.01) | |
| *H01L 31/18* | (2006.01) | |
| *H01L 31/107* | (2006.01) | |
| *H01L 31/00* | (2006.01) | |
| *H01L 23/60* | (2006.01) | |
| *H01L 23/62* | (2006.01) | |

(52) U.S. Cl.
CPC ........ *H01L 31/02016* (2013.01); *H01L 23/60* (2013.01); *H01L 23/62* (2013.01); *H01L 27/0248* (2013.01); *H01L 27/1446* (2013.01); *H01L 31/00* (2013.01); *H01L 31/02* (2013.01); *H01L 31/02005* (2013.01); *H01L 31/02027* (2013.01); *H01L 31/107* (2013.01); *H01L 31/1075* (2013.01); *H01L 31/1876* (2013.01)

(58) Field of Classification Search
CPC ... H01L 31/00; H01L 31/02; H01L 31/02016; H01L 31/107; H01L 31/1075; H01L 23/60; H01L 23/62
See application file for complete search history.

(56) References Cited

U.S. PATENT DOCUMENTS

| | | | | |
|---|---|---|---|---|
| 7,545,423 | B2* | 6/2009 | Park | H01L 27/1462 257/290 |
| 8,482,888 | B2* | 7/2013 | Tsai | H02H 9/045 361/56 |
| 9,029,772 | B2 | 5/2015 | Pavlov | |
| 2006/0092591 | A1* | 5/2006 | Yuan | H01L 27/0251 361/91.1 |
| 2009/0146319 | A1* | 6/2009 | Onda | H01L 22/32 257/782 |
| 2010/0052100 | A1* | 3/2010 | Barth, Jr. | H01L 21/761 257/538 |
| 2014/0231832 | A1* | 8/2014 | Lee | H01L 27/15 257/88 |
| 2015/0285942 | A1* | 10/2015 | Soloviev | E21B 47/00 250/261 |

(Continued)

OTHER PUBLICATIONS

International Search Report and Written Opinion for International Application No. PCT/EP2018/070092, dated Nov. 12, 2018, 13 pages.

(Continued)

*Primary Examiner* — Eduardo A Rodela
(74) *Attorney, Agent, or Firm* — Polansky & Associates, P.L.L.C.

(57) ABSTRACT

The present disclosure relates to a semiconductor photomultiplier which comprises one or more microcells on a substrate having at least one terminal. At least one ESD protection element is operably coupled to the at least one terminal.

30 Claims, 17 Drawing Sheets

(56) References Cited

U.S. PATENT DOCUMENTS

| | | |
|---|---|---|
| 2016/0084964 A1 | 3/2016 | Kimura et al. |
| 2016/0268800 A1* | 9/2016 | Kushner ............. H01L 27/0266 |
| 2016/0365721 A1* | 12/2016 | Soma ............. H03K 19/017509 |
| 2017/0141100 A1* | 5/2017 | Tseng ................... G01R 31/002 |

OTHER PUBLICATIONS

Daisuke Kaneko; "Performance of UV-Sensitive MPPC for Liquid Xenon Detector in MEG Experiment"; 2013 IEEE Nuclear Science Symposium & Medical Imaging Conference—NSS/MIC/RTSD; Oct. 27-Nov. 2; COEX, Seoul, Korea; 5 pages.

* cited by examiner

ESD PROTECTED SEMICONDUCTOR PHOTOMULTIPLIER

FIELD OF THE INVENTION

The present disclosure relates to photon detectors. In particular, the present disclosure relates to high sensitivity photon detectors such as semiconductor photomultipliers. In particular, but not exclusively, the present disclosure relates to semiconductor photomultipliers (SiPMs or SPMs) in such areas as Positron Emission Tomography [PET], including Time-Of-Flight PET [TOF-PET], Laser Ranging [LIDAR] applications, bio luminescence, and High Energy Physics [HEP] detectors.

BACKGROUND

SiPMs are semiconductor photon sensitive devices made up of an array of very small Geiger-mode avalanche photodiode (APD) cells on a semiconductor substrate such as silicon. An example 10×10 microcell array is shown in FIG. 1 of the accompanying drawings. Each cell is connected to one another to form one larger device with one signal output. The entire device size can be as small as 1×1 mm or much larger.

APD cells vary in dimension from 10 to 100 microns depending on the mask used, and can have a density of up to 3000 microcells/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength, but has high multiplication noise. InGaAs (Indium Gallium Arsenide) detects to a maximum wavelength of 1.6 µm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 µm, requires cooling to reduce dark currents, and can achieve a very low level of excess noise.

Silicon avalanche diodes can function with breakdown voltages of 20 to 500V, typically. APDs exhibit internal current gain effect of about 100-1000 due to impact ionization, or avalanche effect, when a high reverse bias voltage is applied (approximately 20-200 V in silicon, depending on the doping profile in the junction). Silicon PhotoMultipliers or SiPMs can achieve a gain of $10^5$ to $10^6$ by using Geiger mode APDs which operate with a reverse voltage that is greater than the breakdown voltage, and by maintaining the dark count event rate at a sufficiently low level. The current generated by an avalanche event must be quenched by an appropriate current limited scheme so that the device can recover and reset after an avalanche event.

Many SPM [Silicon Photomultiplier] applications call for a fast light-to-current response, with order of 1 ns or even shorter time constants. Improved time response would benefit such applications as time-resolved spectroscopy, LIDARs, TOF [time of flight] PET [Positron Emission Tomography] etc. One such SPM is described in U.S. Pat. No. 9,029,772 which is assigned to the present Applicant and the contents of which is incorporated herein by reference. U.S. Pat. No. 9,029,772 includes a fast output terminal arrangement which is illustrated as FIG. 3 in the present Application.

The robustness of an IC to electro static discharge (ESD) is an important consideration that is determined by its capability to safely discharge a high current pulse generated during an ESD event without developing excessive voltage levels or heating that can cause damage to devices on the IC.

There is therefore a need to provide a semiconductor photomultiplier which addresses at least some of the drawbacks of the prior art.

SUMMARY

Accordingly, the is provided a semiconductor photomultiplier comprising:
one or more microcells on a substrate having at least one terminal; and
at least one ESD protection element operably coupled to the at least one terminal.

In one aspect, the at least one ESD protection element is not photosensitive.

In another aspect, at least one of the microcells is photosensitive.

In a further aspect, the majority of the microcells are photosensitive.

In one exemplary aspect, at least some of the microcells are dummy microcells.

In a further exemplary aspect, the majority of the microcells are dummy microcells.

In another aspect, the minority of the microcells are photosensitive.

In one aspect, the microcells are arranged in two of more discrete arrays each array having an independent terminal.

In a further aspect, each terminal is operably coupled to a corresponding ESD protection element.

In one aspect, the at least one ESD protection element is positioned such that it does not receive light.

In a further aspect, the at least one ESD protection element is covered by an opaque material or an opaque coating.

In another aspect, the at least one ESD protection element is covered by a metal material.

In one aspect, the at least one ESD protection element is located beneath a bond pad.

In a further aspect, the ESD protection element is a diode.

In an exemplary aspect, the ESD protection element is coupled to a capacitive load.

In another exemplary aspect, two or more ESD protection elements are provided.

In one aspect, at least some of the microcells comprise a photo-detector diode.

In another aspect, the breakdown voltage of the photo-detector diode is substantially equal to the breakdown voltage associated with the ESD protection diode.

In another aspect, the breakdown voltage of the ESD protection diode is configured to be lower than the breakdown voltage of the photo-detector diode.

In one aspect, the breakdown voltage of the ESD protection diode is configured to be higher than the breakdown voltage of the photo-detector diode.

In another aspect, the active areas of the ESD protection diode is less than the active areas of the photo-detector diode.

In one aspect, the ESD protection diode is an avalanche diode.

In a further aspect, the ESD protection diode is operably coupled in series to a resistor.

In one aspect, the ESD protection diode is forward biased.

In another aspect, the ESD protection diode is reversed biased.

In one exemplary aspect, the breakdown voltage of the ESD protection diode is in the range of 10 Volts to 150 Volts.

In another exemplary aspect, the breakdown voltage of the ESD protection diode is in the range of 20 Volts to 70 Volts.

In a further aspect, the breakdown voltage of the ESD protection diode is in the range of 24 Volts to 40 Volts.

In one aspect, the at least one ESD protection diode and the photo detector diodes are of the same type.

In another aspect, the at least one ESD protection diode is of a first type while the photodetector diode is of a second type.

In a further aspect, the first type has an active area of a first size; and the second type has an active area of a second size.

In an exemplary aspect, the first size is less than the second size.

In one aspect, the first size is of area such that the breakdown voltage of the ESD protection diode is above the maximum operating voltage of each microcell.

In another aspect, the first size is of area such that the breakdown voltage of the ESD protection diode is below the maximum operating voltage of each microcell.

In one aspect, the doping profile of the active area of the ESD protection diode is different to the doping profile of the active area of the photo-detector diode such that the breakdown voltage of the ESD protection diode is higher than the breakdown voltage of the photo-detector diode.

In a further aspect, the doping profile of the active area of the ESD protection diode is different to the doping profile of the active area of the photo-detector diode such that the breakdown voltage of the ESD protection diode is lower than the breakdown voltage of the photo-detector diode.

In one aspect, the ESD protection diode has a junction defining an enhanced curvature compared to the junction of the photo-detector diode.

The present disclosure also relates to a semiconductor substrate comprising:
one or more microcells having at least one terminal; and
at least one ESD protection element operably coupled to the at least one terminal.

Furthermore, the present teaching relates to a method of fabricating a semiconductor photomultiplier, the method comprising:
providing one or more microcells on a substrate having at least one terminal; and
providing at least one ESD protection element operably coupled to the at least one terminal.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

Figure 1:
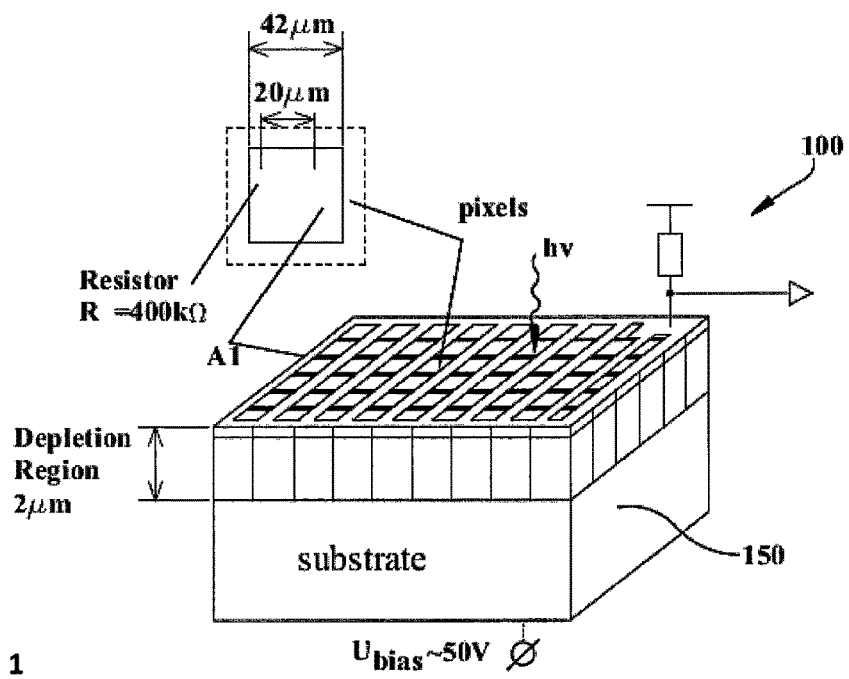
FIG. 1 illustrates an exemplary structure of a semiconductor photomultiplier.

The present disclosure will now be described with reference to some exemplary semiconductor photomultipliers. It will be understood that the exemplary semiconductor photomultipliers are provided to assist in an understanding of the teaching and is not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

Referring initially to FIG. 1, a semiconductor photomultiplier 100 comprising an array of Geiger mode photodiodes is shown. The array is formed on a semiconductor substrate 150 using semiconductor processes which will be known to one skilled in the art and may include for example, but not limited to, deposition, implantation, diffusion, patterning, doping, and etching. Patterned layers of conducting material, insulating material and doped areas of semiconductor form the structure of the photodiode. As illustrated, a quench resistor is provided adjacent to each photodiode which may be used to limit the avalanche current. The photodiodes are electrically connected to common biasing and ground electrodes by aluminium or similar conductive tracking.

Figure 2:
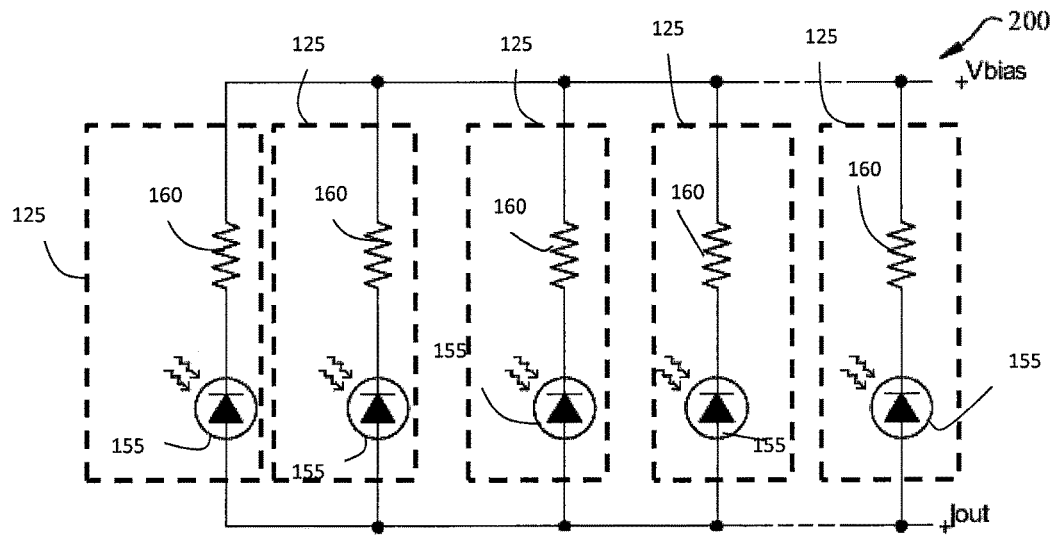
FIG. 2 is a schematic circuit diagram of an exemplary semiconductor photomultiplier.

An equivalent circuit schematic is shown in FIG. 2 for a conventional semiconductor photomultiplier 200 in which the anodes of an array of photo-detector diodes 155 are connected to a common ground electrode and the cathodes of the array are connected via current limiting resistors 160 to a common bias electrode for applying a bias voltage across the diodes.

The semiconductor photomultiplier 100 consists of an array of repeating structures called microcells 125. Each microcell 125 generates a highly uniform and quantized amount of charge every time the microcell 125 undergoes a Geiger breakdown. The gain of a microcell 125 (and hence the detector) is defined as the ratio of the output charge to the charge on an electron. The output charge can be calculated from the over-voltage and the microcell capacitance.

$$G = \frac{C \cdot \Delta V}{q}$$

Where:
  G is the gain of the microcell;
  C is the capacitance of the microcell;
  ΔV is the over-voltage; and
  q is the charge of an electron.

Figure 3:
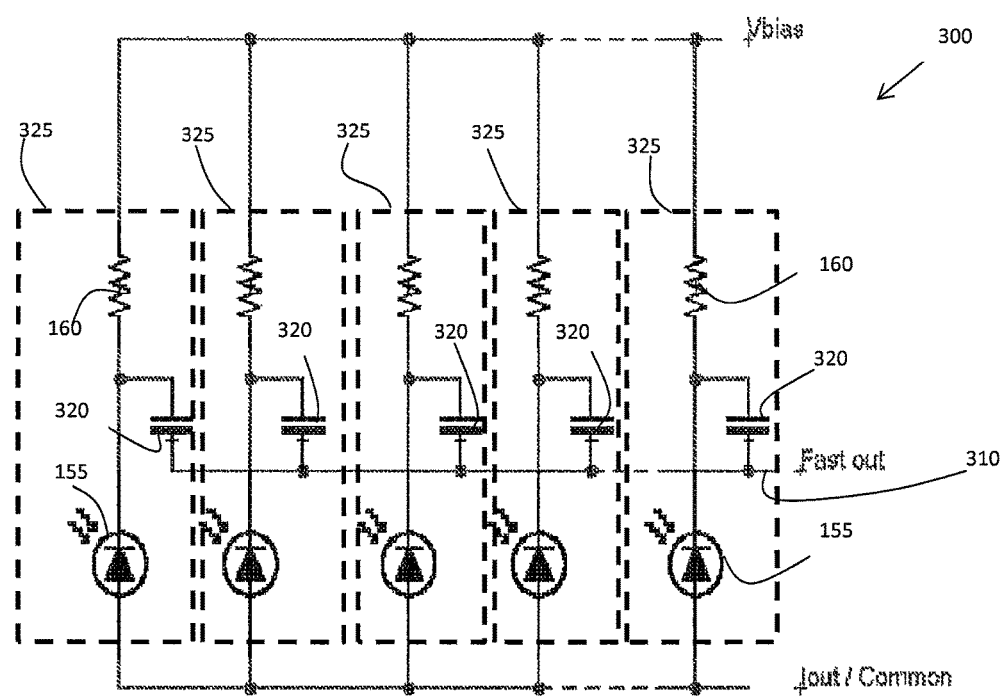
FIG. 3 is a schematic circuit diagram of an exemplary semiconductor photomultiplier.

FIG. 3 illustrates a semiconductor photomultiplier 300 as described in U.S. Pat. No. 9,029,772 which is assigned to the present Applicant and the contents of which is incorporated herein by reference. The semiconductor photomultiplier 300 includes a fast output terminal 310 which is capacitively coupled to each photodiode cathode to provide a fast readout of the avalanche signals from the photo-detector diodes 155. When the photodiode emits a current pulse, part of the resulting change in voltage at the cathode will be coupled via mutual capacitance into the fast output terminal 310. Using the fast output terminal 310 for readout avoids the compromised transient performance resulting from the relatively large RC time constant associated with the biasing circuit. Each microcell 325 of the semiconductor photomultiplier 300 includes a photo-detector diode 155, a current limiting resistor 160; and a capacitor 320 coupled to the fast output terminal 310.

The fast output terminal 310 which is capacitively coupled to the quench resistor 160 in each microcell 325 allows a fast small signal output to indicate photon detection. However, this arrangement suffers from poor ESD performance as it is limited by the dielectric strength between the fast output terminal 310 and the quench resistor 160. Electrostatic discharge, (ESD), events can occur at any stage in the processing or handling of integrated circuits (ICs).

Figure 4A:
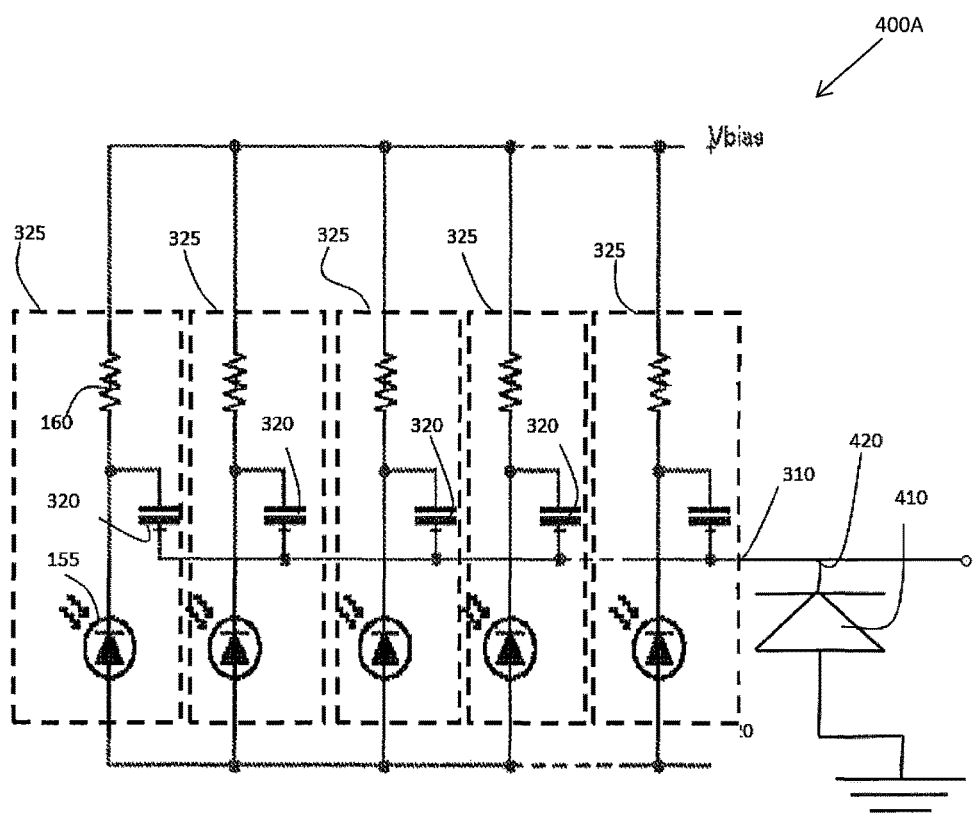
FIGS. 4A to 4D are schematic circuit diagrams of exemplary ESD protected semiconductor photomultipliers.

Referring to FIG. 4A there is illustrated an ESD protected semiconductor photomultiplier 400A in accordance with the present teaching. The ESD protected semiconductor photomultiplier 400A is similar to the semiconductor photomultiplier 300 and like elements are indicated by similar reference numerals. The primary difference is that the ESD protected semiconductor photomultiplier 400A includes an ESD protection element operably coupled to the fast output terminal 310. In the exemplary arrangement the ESD protection element is an ESD protection diode 410. The node 420 where the ESD protection diode 410 is coupled to the fast output terminal 310 floats to a potential close to zero, adding a small amount of capacitance to the fast readout electrode 310. However in the case of an ESD event at the fast output terminal 310 the ESD protection diode 410 either reverse biases and dissipates the ESD charge through impact ionisation to substrate 150 or forward biases and dissipates the ESD charge though forward bias injection to substrate 150. Because the charge constituting the ESD event is dissipated through the ESD protection diode 410 the fast capacitor dielectric is protected from high voltages.

Figure 4B:
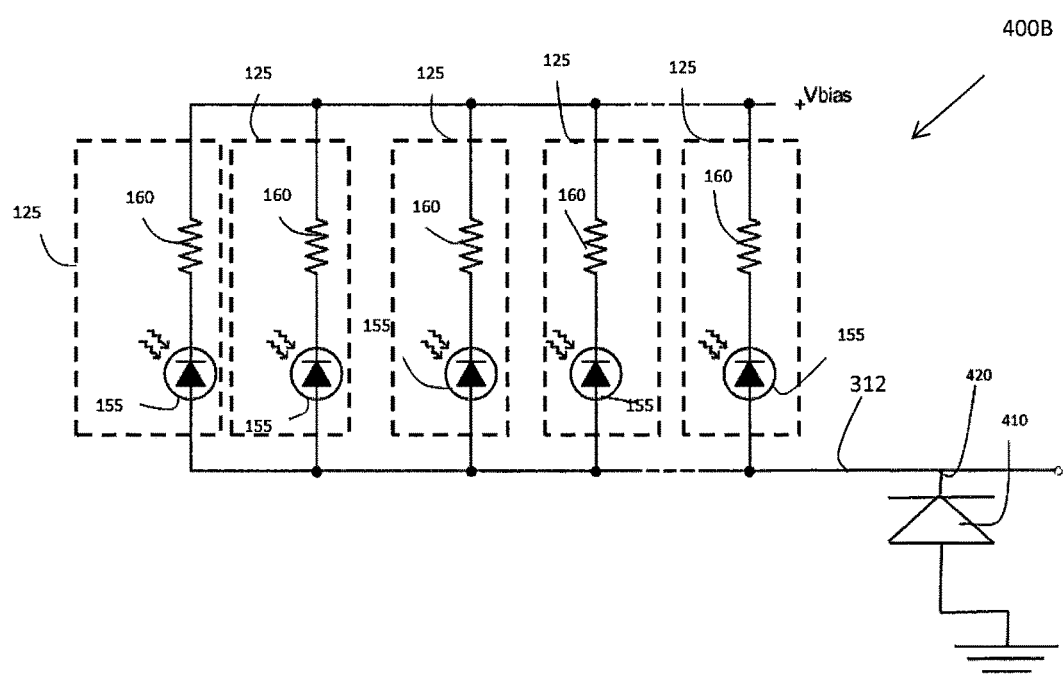

Referring to FIG. 4B there is illustrated another ESD protected semiconductor photomultiplier 400B which is also in accordance with the present teaching. The ESD protected semiconductor photomultiplier 400B is similar to the semiconductor photomultiplier 200 and like elements are indicated by similar reference numerals. The primary difference is that the ESD protected semiconductor photomultiplier 400B includes an ESD protection element operably coupled to the output terminal 312. In the case of an ESD event at the output terminal 312, the ESD protection diode 410 either reverse biases and dissipates the ESD charge through impact ionisation to substrate 150 or forward biases and dissipates the ESD charge though forward bias injection to substrate 150.

Figure 4C:
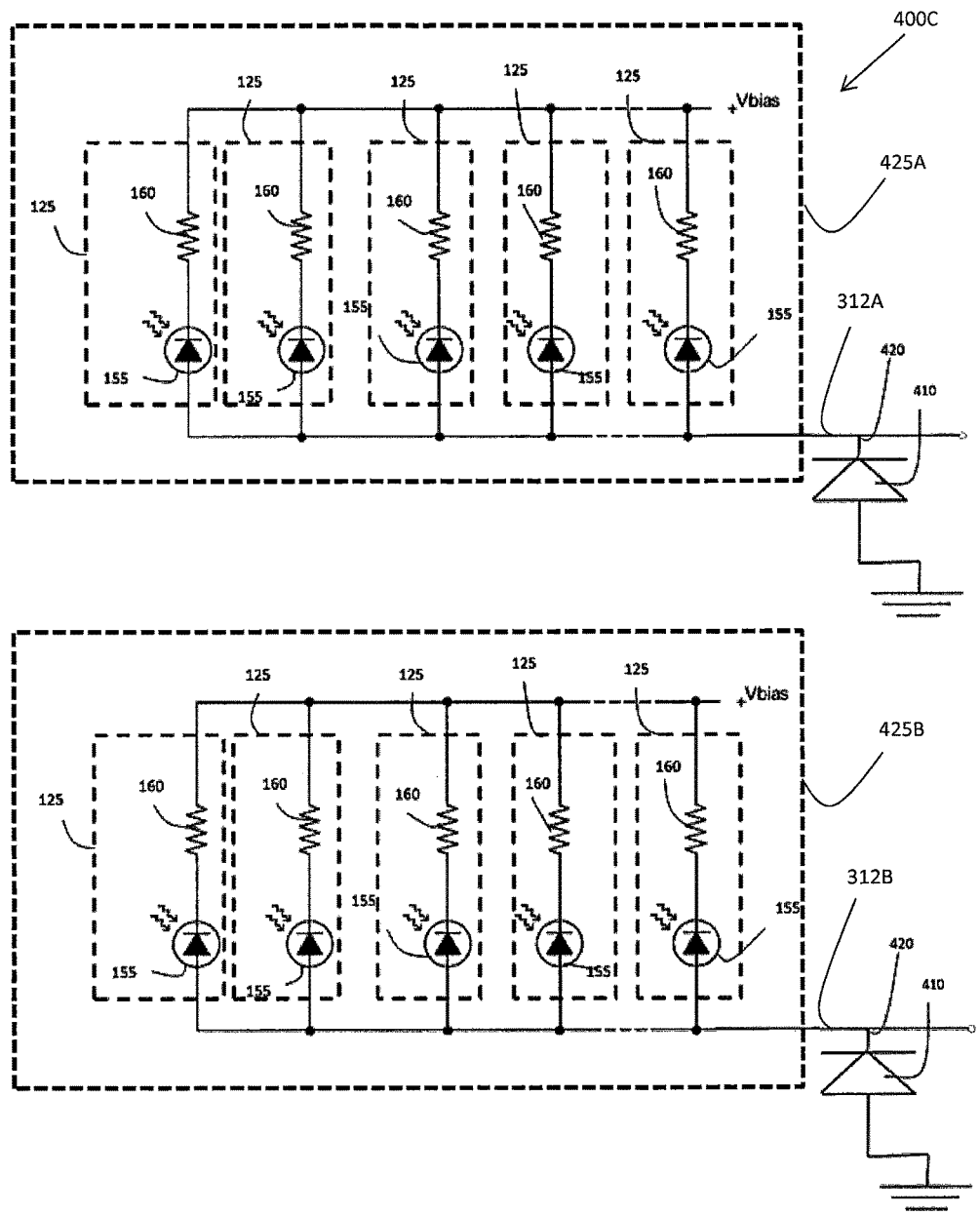

Referring to FIG. 4C there is illustrated another ESD protected semiconductor photomultiplier 400C which is also in accordance with the present teaching. The ESD protected semiconductor photomultiplier 400C is substantially similar to the ESD protected semiconductor photomultiplier 400B. The primary difference is the ESD protected semiconductor photomultiplier 400C includes two discrete arrays 425A, 425B of microcells 125, in which each discrete array 425A, 425B has an independent output terminal 312A, 312B. Each output terminal 312A, 312B is operably coupled to a corresponding ESD protection diode 410. In the exemplary embodiment, at least one ESD protection diode 410 is positioned such that it does not receive light. For example, at least one ESD protection diode 410 may be covered by an opaque material or an opaque coating. In one exemplary arrangement at least one ESD protection diode is covered by a metal material.

Figure 4D:
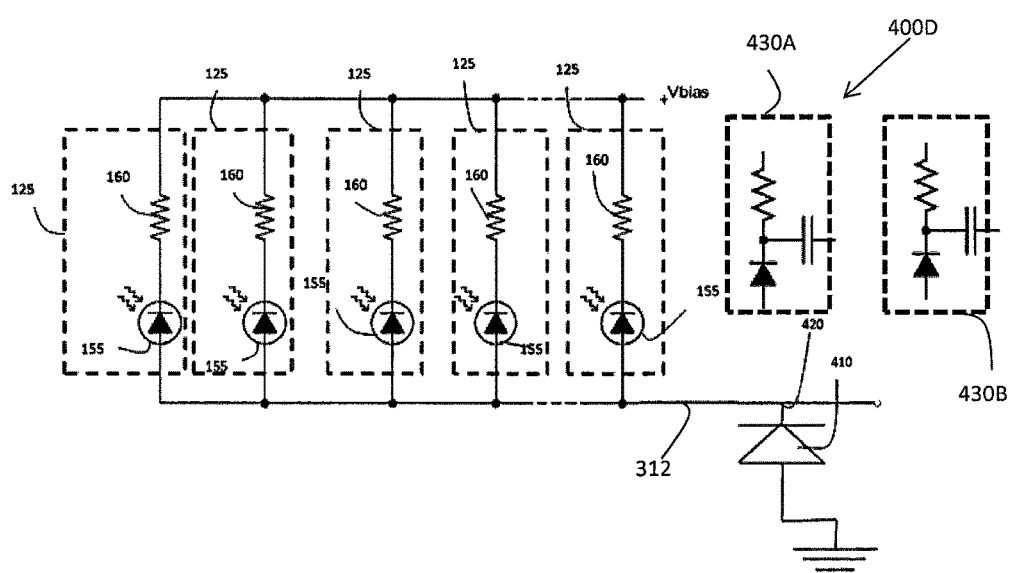

Referring to FIG. 4D there is illustrated another ESD protected semiconductor photomultiplier 400D which is also in accordance with the present teaching. The ESD protected semiconductor photomultiplier 400D is substantially similar to the ESD protected semiconductor photomultiplier 400B and like elements are indicated by similar reference numerals. The primary difference is the ESD protected semiconductor photomultiplier 400D includes dummy microcells 430A, 430B. The ESD protected semiconductor photomultiplier 400D includes a plurality of interconnected photosensitive microcells 125. It will be appreciated by those of ordinary skill in the art that only a section of the ESD protected semiconductor photomultiplier 400D is illustrated in FIG. 4D for convenience. Adjacent the array there is provided DCR suppression elements (inactive dummy microcells 430A, 430B). The DCR suppression elements suppress the dark count rate of the neighbouring photosensitive microcells 125. In the exemplary arrangement, the DCR suppression elements are dummy unpowered microcells 430A, 430B. The active microcells 125 are electrically coupled between the cathode and anode power tracks. In contrast, the dummy microcells 430A, 430B are not electrically coupled to cathode or anode power tracks. Thus the dummy microcells 430A, 430B are electrically isolated from the active microcells 125. It will be appreciated that the semiconductor photomultiplier 400D comprises a plurality of interconnected microcells 125 on a substrate 150 having at least one output terminal 312, and at least one ESD protection diode 410 operably coupled to the at least one output terminal 312. The majority of the interconnected microcells 125 are photosensitive. However, at least some of the microcells may be dummy microcells. It is envisaged in an alternative arrangement that the majority of the microcells are dummy microcells 430A, 430B while the minority of the microcells 125 are photosensitive.

Figure 5A:
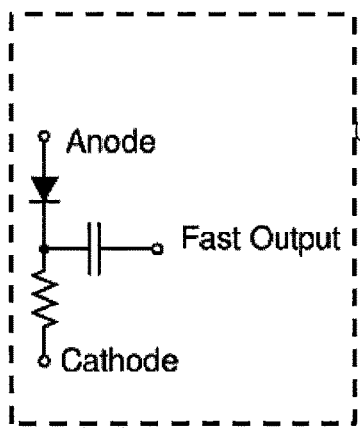
FIGS. 5A to 5H are schematic circuit diagrams of microcells which may be used in an ESD protected semiconductor photomultiplier in accordance with the present teaching.

Referring to FIG. 5A to 5H there is illustrated a plurality of different microcell configurations 125A-125H that could be used to form the array microcells in the ESD protected semiconductor photomultipliers 400A-400D. FIG. 5A illustrates an N on P SiPM micocell 125A which consists of n-doped avalanche photodiode on a p-type substrate with a resistor performing passive quenching. Each microcell has a capacitive coupling enabling the "fast output" pulse to be derived which has narrow pulse width of the order of nanoseconds. This process is optimised for detection of longer wavelength light in IR region which is of particular interest in automotive LiDAR applications.

Figure 5B:
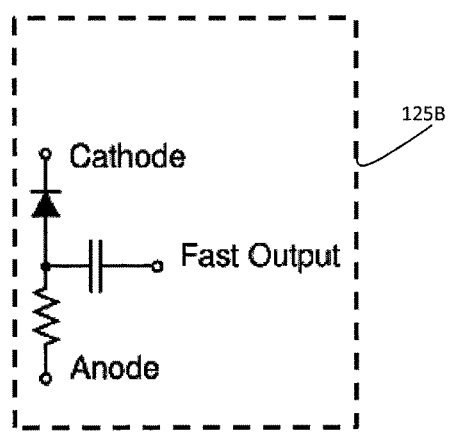
Figure 5C:
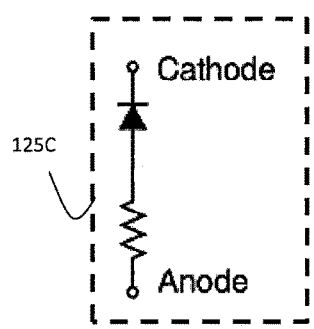
Figure 5D:
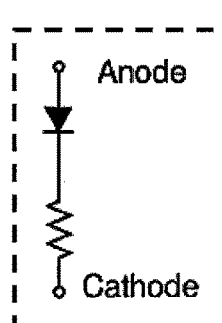
Figure 5E:
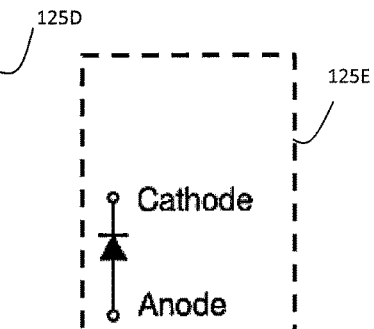
Figure 5F:
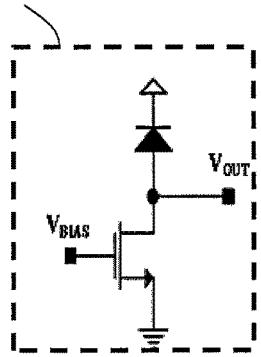
Figure 5G:
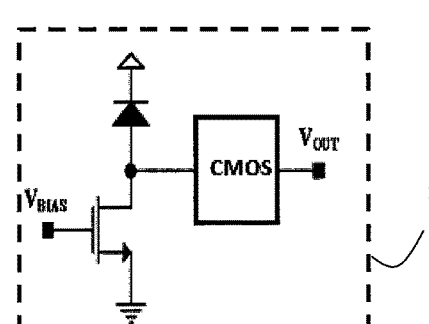
Figure 5H:
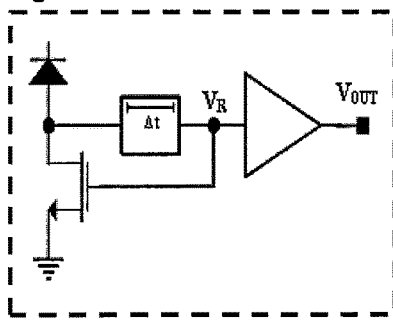

FIG. 5B illustrates a P on N SiPM microcell 125B which consists of n-doped avalanche photodiode on a p-type substrate with a resistor performing passive quenching. Each microcell has a capacitive coupling enabling the "fast output" pulse to be derived which has narrow pulse width of the order of nanoseconds. This process is optimized for shorter wavelength blue detection frequently used in the biomedical scanning area, for example. FIGS. 5C and 5D illustrate SiPM microcells 125C, 125D with a resistive quench resistor. This is a standard type of microcell which consists of the p on n or n on p device connected to a passive quench resistor but without the fast capacitor coupling. FIG. 5E illustrate an SiPM microcell 125E which consists only of an avalanche photodiode (APD). In this case quenching would be performed off chip actively or passively. FIG. 5F illustrates a microcell 125F formed with a hybrid APD CMOS process. The APD may be formed on a substrate with CMOS transistors which opens up many possibilities for the design of the microcell. FIG. 5G illustrates a microcell 125G which includes a CMOS transistor quench. The resistive quench resistor is replaced with a CMOS resistive quench circuit. The Vbias gate voltage on the transistor is adjusted to give a particular effective quench resistance. FIG. 5H illustrates a microcell 125H which includes a CMOS transistor quench with additional CMOS readout circuitry. The additional CMOS readout circuitry may be placed on the output of the APD transistor junction to perform signal conditioning and interfacing to external circuitry. In this microcell configuration the APD is actively quenched by feeding back the signal to the quenching transistor and a time delay less than the passive quench time. The active quench circuit may or may not be followed by more on chip circuitry, for example a buffer.

Figure 6:
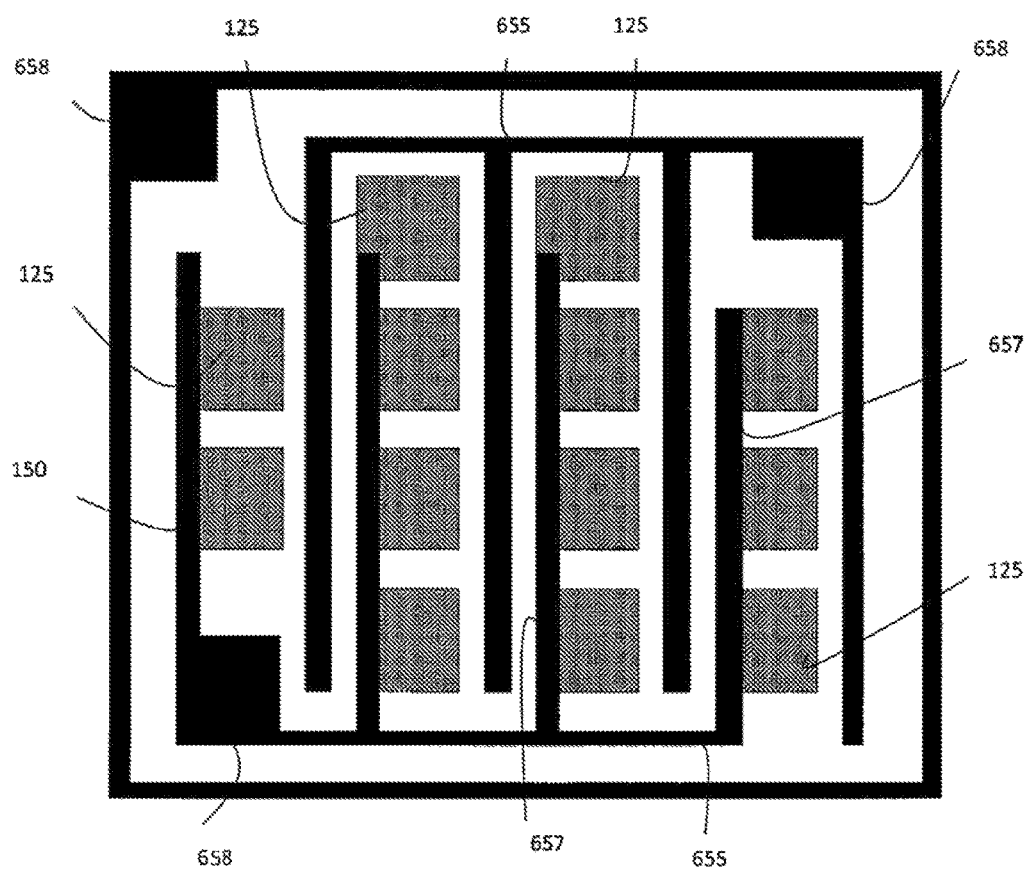
FIG. 6 is an exemplary layout configuration of a semiconductor photomultiplier.

It will be appreciated by those skilled in the art that SPMs comprise major bus lines 655 and minor bus lines 657 as illustrated in FIG. 6. The minor bus lines 657 connect directly to the outputs of the microcells 125. The minor bus lines 657 are then coupled to major bus line 655 which connect to the bond pads 658 associated with readout terminals such as the fast output terminal 310. Typically, the minor bus lines 657 extend vertically between the columns of microcells 125, while the major bus lines 655 extend horizontally adjacent the outer row of the microcells 125. The ESD protection diode 410 may be located underneath metal pads 158 as it is not required to be light sensitive. In this way the inclusion of the ESD protected elements do not negatively affect the efficiency of the detector. Since the ESD protection elements may be located below a metal track or bond pad the footprint of the active areas of the detector microcells is maximised for detecting light. The ESD protection elements do not occlude the transmission of light to the active areas of the detector microcells.

Figure 7A:
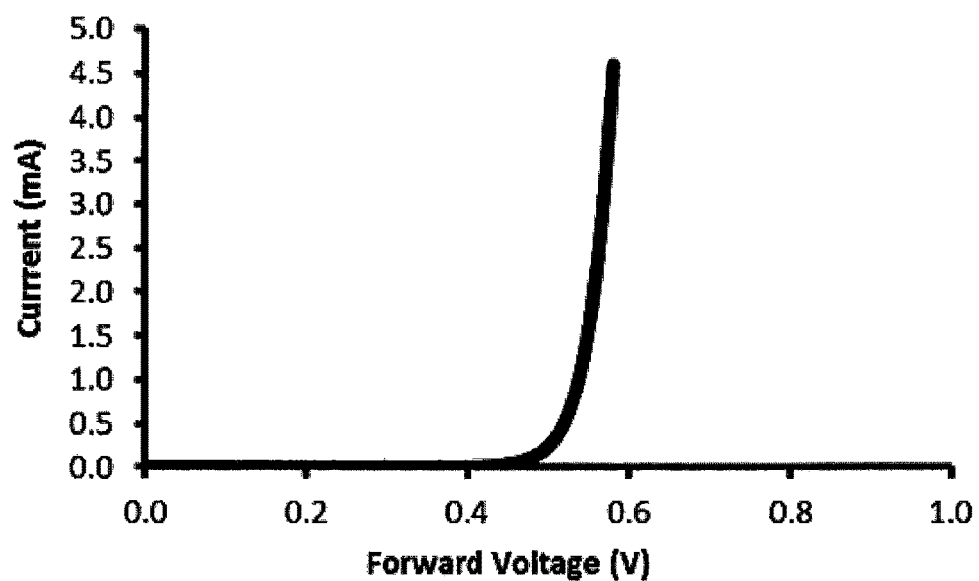
FIGS. 7A and 7B show typical current versus voltage characteristic for a modelled microcell.
Figure 7B:
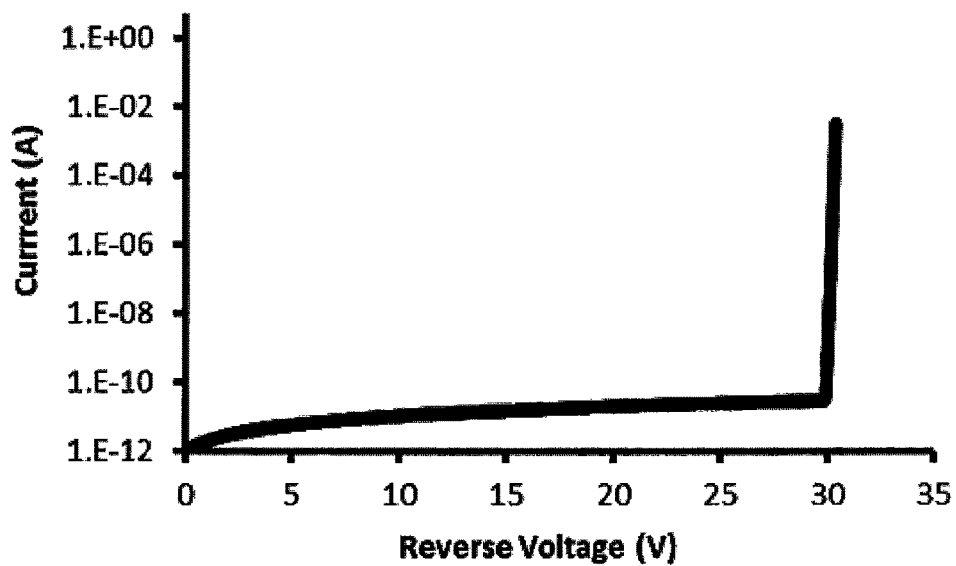

When the ESD protection diode 410 is forward biased at around 0.5V the ESD protection diode 410 starts to conduct current, providing a low impedance path to discharge the energy from the ESD event. The ESD protection diode 410 limits the voltage that can build up across fast output terminal 310. FIG. 7A and FIG. 7B show typical current versus voltage characteristic for the ESD protected semiconductor photo-multiplier 400A of FIG. 4A. The curves show that the current rapidly increases above the 0.5V forward bias threshold. When a reverse voltage is applied to the ESD protection diode 410 there is a small amount of current in the picoamp region until the reverse breakdown voltage is reached. Breakdown voltage is typically in the region of 24V to 40V for SiPMs. The ESD protection diode 410 modelled for the plot has a reverse breakdown voltage of 30V.

Figure 8:
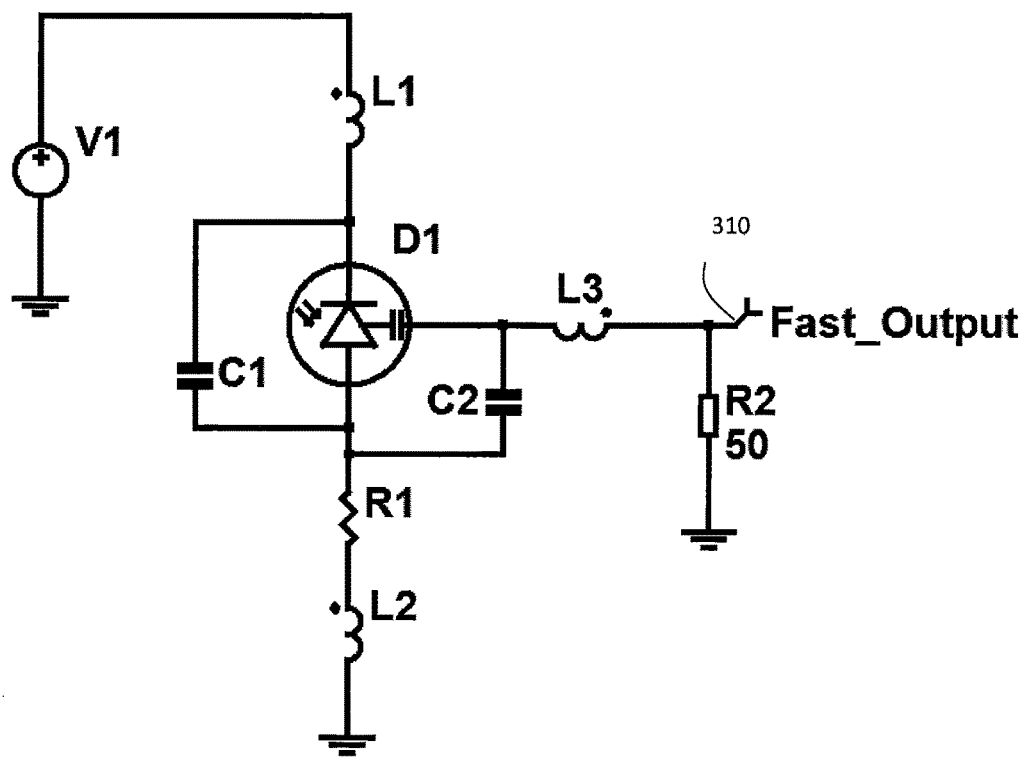
FIG. 8 illustrates an exemplary circuit model for N on P process SiPM.

Referring to FIG. 8 which illustrates a model of an n on p process SiPM incorporating an external bias supply V1, fast output readout across a 50 ohm resistor R2 and the parasitic package level components C1, C2, L1, L2, L3 and R1. The bias voltage V1 is typically 5 to 10 V above the breakdown voltage, that is 35 to 40 V. C1 and C2 are the parasitic capacitors formed from the wire bond pads of the cathode and fast outputs to the p-type substrate of the silicon to which the anode is connected. Typical wire bond capacitance is of the order of 270 fF. L1, L2 and L3 represent parasitic inductance due to the wire bond connection from the SiPM bond pads on the top surface of the silicon to the package's pins and the inductance of the package pins itself. Wire bond inductance is modelled as 500 pH in series with the pad inductance of 150 pF. R1 represents the parallel via and track resistance from the p-type silicon substrate of the SiPM to the anode wire bond pad and also includes a component of the resistivity of the substrate. The value used in the model is 10 ohms. D1 contains the lumped model of the SiPM.

Figure 9A:
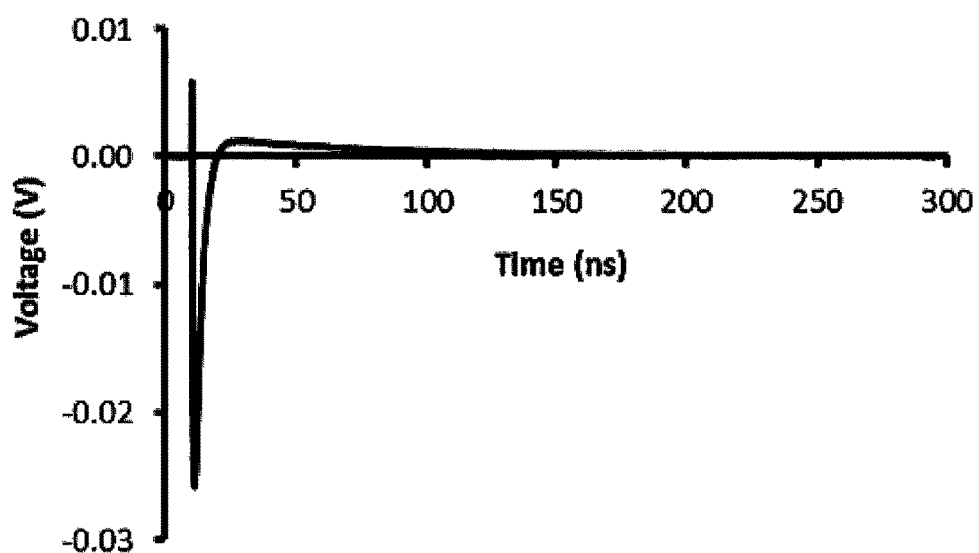
FIGS. 9A and 9B show typical current versus voltage characteristic for the circuit model of FIG. 8.
Figure 9B:
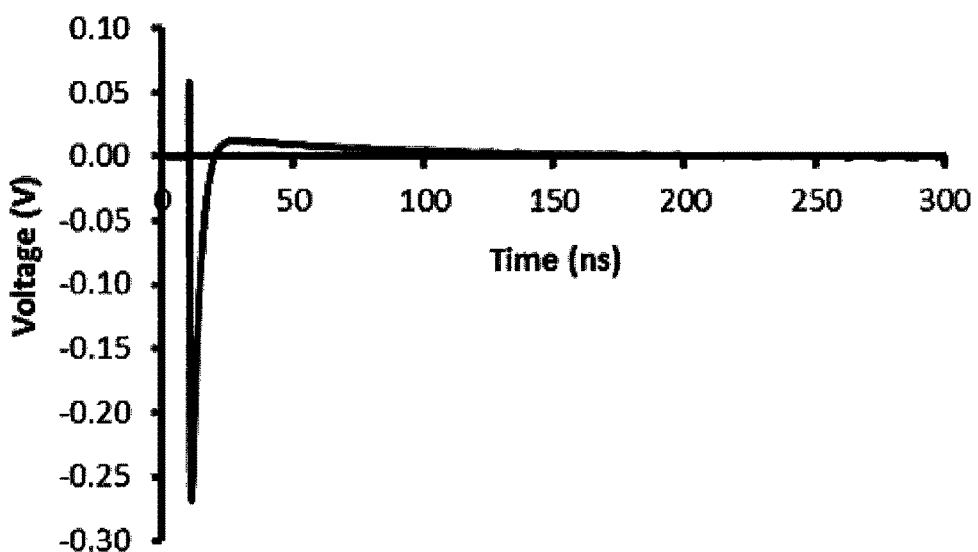

Exemplary responses to the impulses of light are shown in FIGS. 9A and 9B. In FIG. 9A the response to 10% of the microcells triggering is shown. The output pulse is negative going and has amplitude of approximately −25 mV and full width half maximum in the order of nanoseconds. FIG. 9B shows the response to firing all the microcells in the SiPM. In this case, the amplitude increases to approximately −250 mV while maintaining a similar pulse width. Internally in the SiPM the fast output has a capacitive coupling to the APDs in the microcells. Since the external load resistor R2 is referenced to ground and the fast output is capacitively coupled then the output is an AC signal with average value of ground. After the initial sharp pulse there is a positive going overshoot which slowly decays back to ground level.

Figure 10:
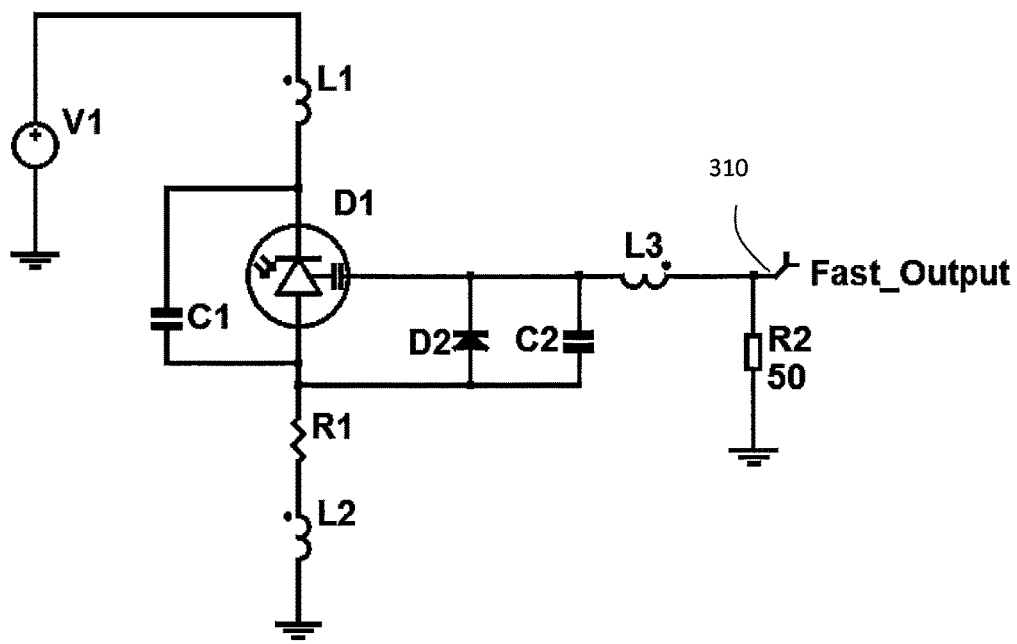
FIG. 10 illustrates an exemplary circuit model for N on P process SiPM including an ESD protection diode.
Figure 11A:
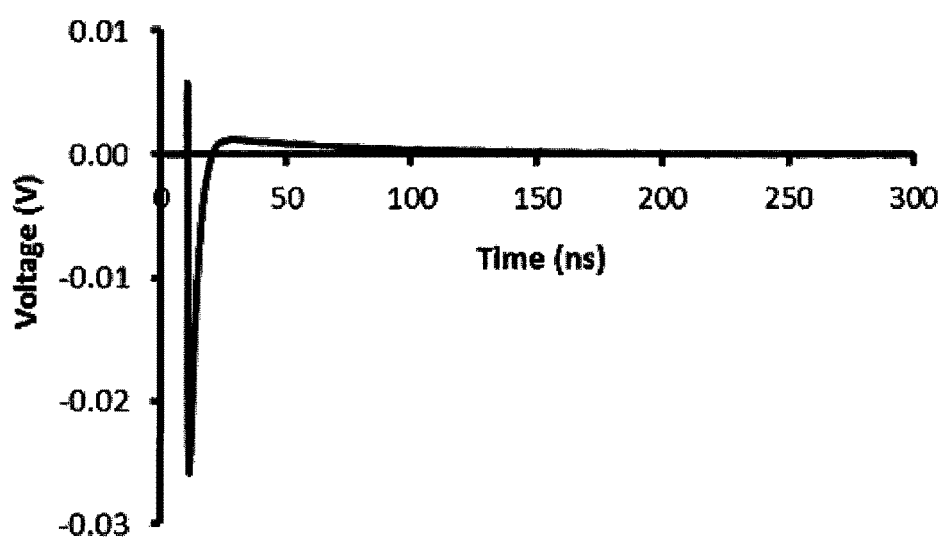
FIGS. 11A and 11B show typical current versus voltage characteristic for the circuit model of FIG. 10.
Figure 11B:
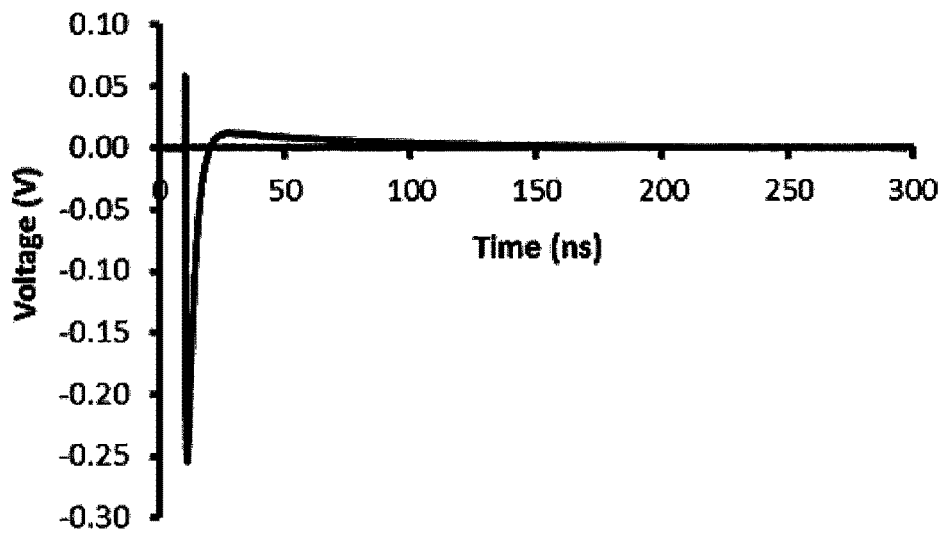

Referring to FIG. 10 there is illustrated an equivalent model of the ESD protected microcell of FIG. 4A with a positive bias configuration. If the fast output terminal 310 is left floating then there is a potential for charge to build up on the output and potential for electrostatic damage. An ESD protection diode D2 may be used to discharge the fast output terminal 310. The diode D2 can be fabricated from the same process as the photo-detector diode 155 in the microcell 325 and placed in the vicinity of the wire bond pad 158 on the fast output terminal 310. For the cases shown in FIGS. 11A and 11B the fast output terminal 310 is always less than the forward turn on voltage of the diodes and so the output characteristics should not be affected significantly by the inclusion of D2. FIGS. 11A and 11B show the impulse response pulse simulations for 10% and 100% of the microcells firing respectively with the ESD protection diode D2 on the fast output terminal 310. By comparing these figures with the equivalent simulations shown in the FIGS. 9A and 9B it can be seen that the inclusion of the ESD protection diode D2 has no significant effect in these cases.

Figure 12:
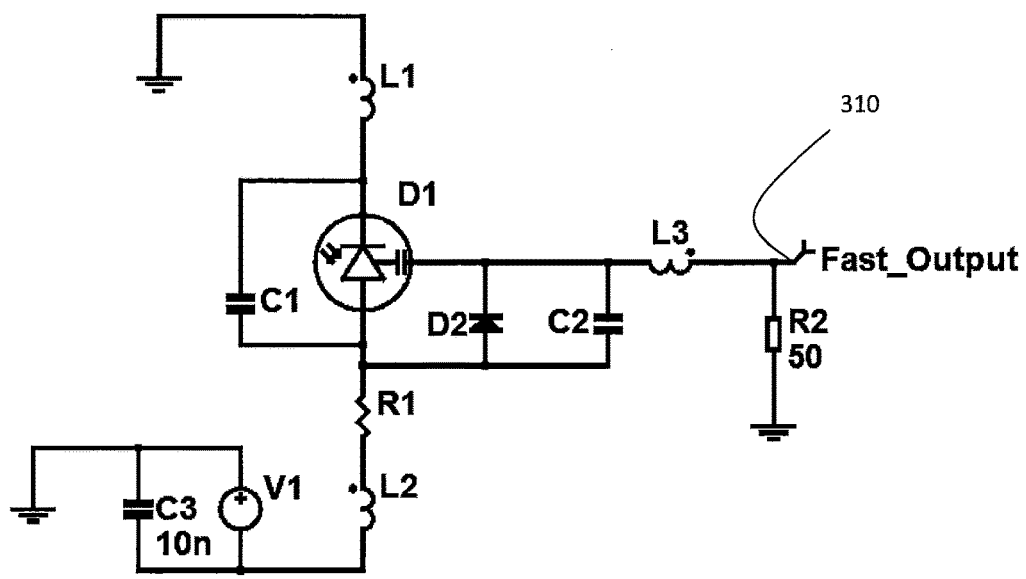
FIG. 12 is a negative bias configuration for the SiPM models using negative bias on the anode and ground at the cathode.
Figure 13A:
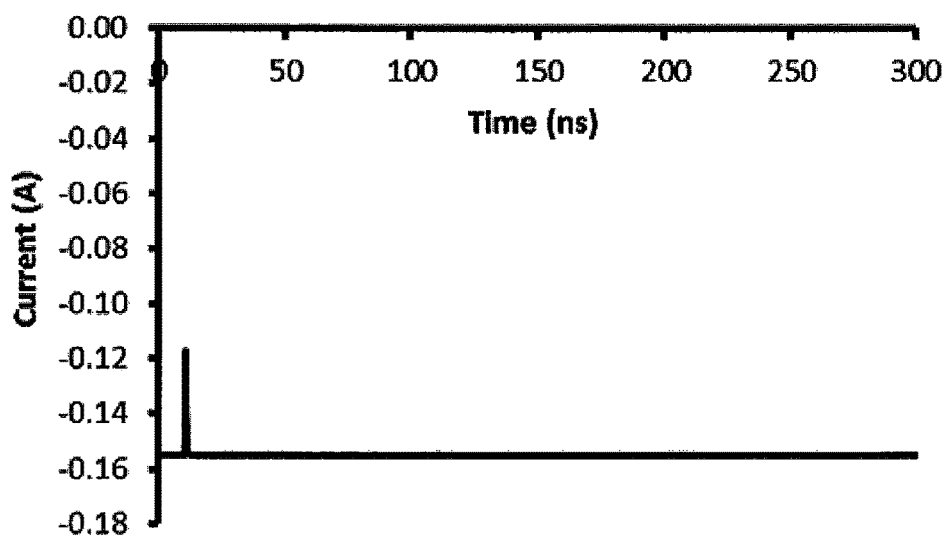
FIGS. 13A, 13B and 13C show typical current versus voltage characteristic for the circuit model of FIG. 12.
Figure 13B:
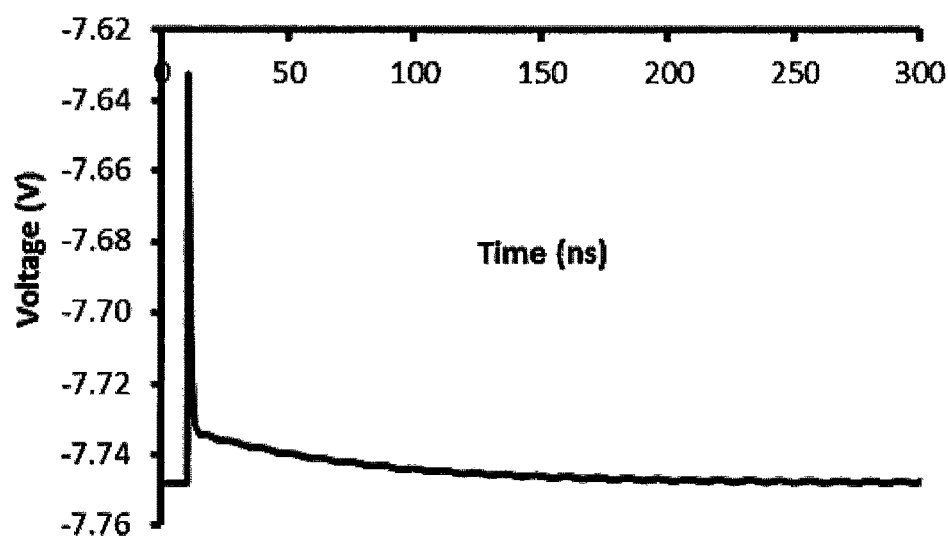

Referring to FIG. 12 there is illustrated an equivalent model of an ESD protected microcell of FIG. 4A with a negative bias configuration. The negative bias configuration is attractive from the reliability perspective since the voltage across the fast output capacitors in quiescent conditions is zero volts, due to the cathode being held at ground and the anode at −Vbias, as opposed to the bias voltage in the previous configurations shown in FIGS. 8 and 10. However there is an issue with the ESD protection diode D2 in this case. D2 has a similar breakdown voltage to the microcells of the SiPM and may causes the diode D2 to be placed in Geiger mode because it has −Vbias at the anode of itself and the SiPM and the cathode of D2 is connected to ground via L3 and R2. Ambient light or a dark noise event would cause D2 to breakdown and the diode would not be properly quenched since the value of load R2 is very low at 50 ohms. Typically quench resistors are orders of magnitude higher. The net effect of this is that D2 would constantly draw current placing a voltage offset at the fast output terminal 310. Simulations to show this are in FIGS. 13A and 13B. 100% of the microcells fire in the simulations. The current flowing through D2 is shown in FIG. 13A. The simulation shows that a DC quiescent current of 155 mA flows through D2. As a consequence of the DC quiescent current flowing through D2 and R2 a voltage offset of around −7.74 V is produced at the fast output as can be seen in FIG. 13B. When the D1 fires the output of the SiPM tries to pull the cathode of D2 more negative, reducing the bias across and current through D2 producing a positive going pulse on the fast output terminal 310.

Figure 13C:
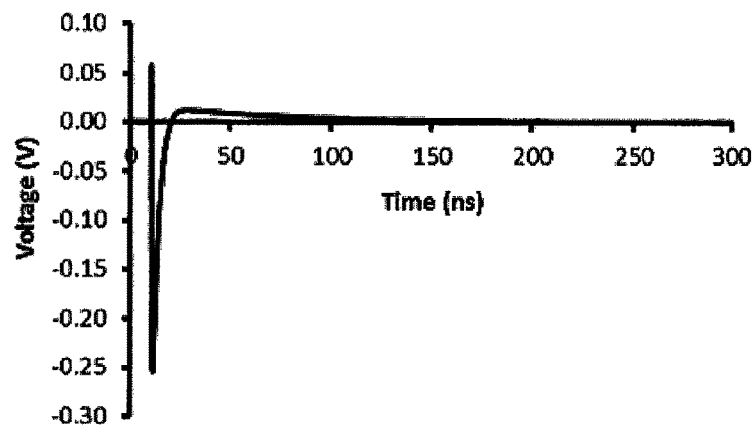

The protection diode may dissipate a lot of power in the standby condition (Vbias−7.74 V*0.155 A=5 W) and it likely to blow very quickly. A solution to this problem would be to increase the breakdown voltage of the ESD protection diode 410 to above the bias voltage being used for the SiPM, i.e. above 40 V for the simulations shown. The disadvantage of this however is that the process for the ESD diode fabrication would need to be different to that of the diodes in the microcells. A simulation results in FIG. 13C of the fast output in a negative bias configuration using an ESD protection diode with a breakdown voltage of 50 V and 100% of microcells firing shows that the fast output is unaffected by the addition of D2 in this case.

Figure 14:
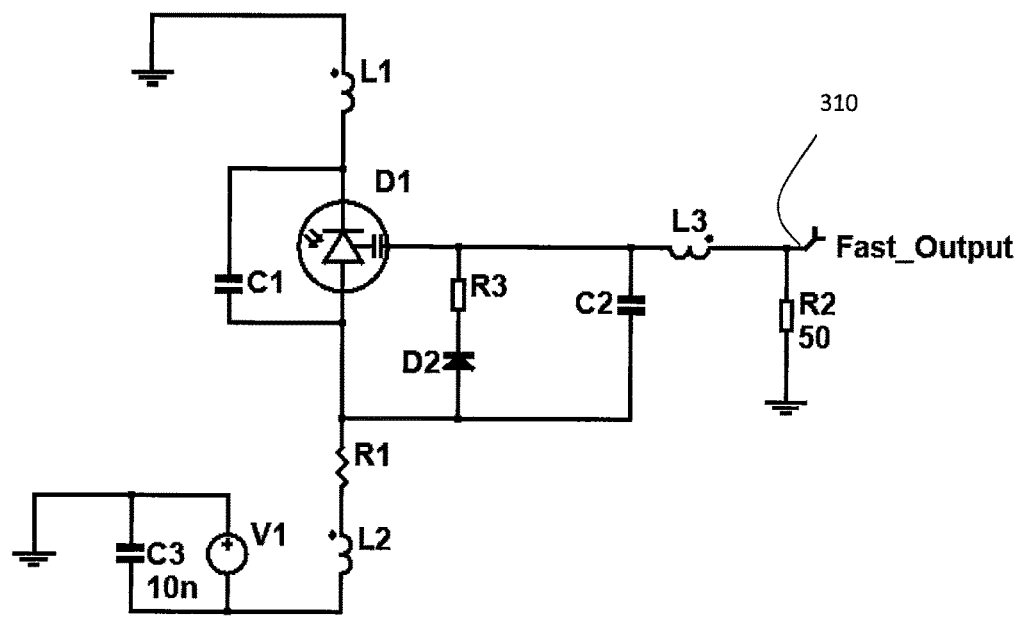
FIG. 14 is an alternative configuration for an SiPM in accordance with the present teaching.
Figure 15A:
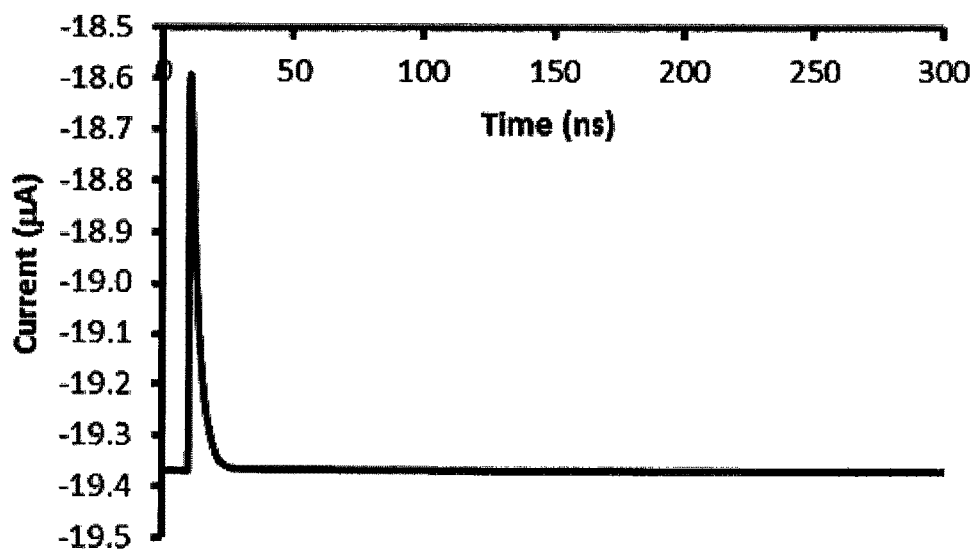
FIGS. 15A and 15B show exemplary current versus voltage characteristic for the circuit model of FIG. 14.
Figure 15B:
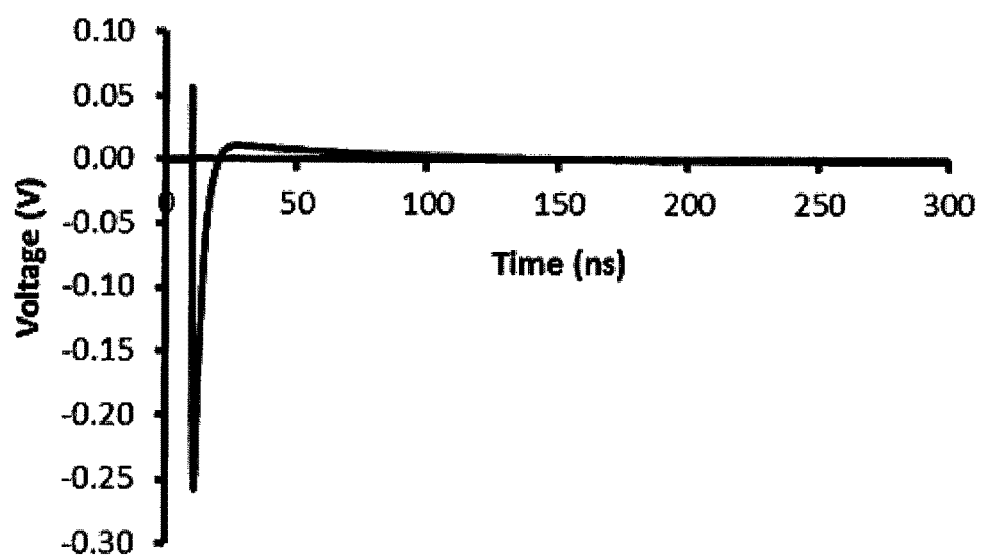

An alternative approach is to place a resistor R3 in series with D2 (D2 having the same breakdown voltage as the SiPM microcells) as shown in FIG. 14. If the value of the resistor R3 is some hundreds of kilo ohms then this helps quench any avalanche events and reduce the DC bias current. The simulation of current through D2 shows that the quiescent current is reduced considerably to 19.4 uA from 0.155 A without the resistor for the simulation when all the microcells fire. This current is approximately (Vbias−Vbr)/500 kohms=(40 V−30 V)/500 kohms=20 uA. The fast output is now virtually unaffected by the inclusion of the ESD protection diode D2. However there is a small negative DC offset voltage across the 50 ohm load of −1 mV (20 uA*50 ohm=1 mV). The offset could be removed by placing an external capacitor in line with the load.

Figure 16:
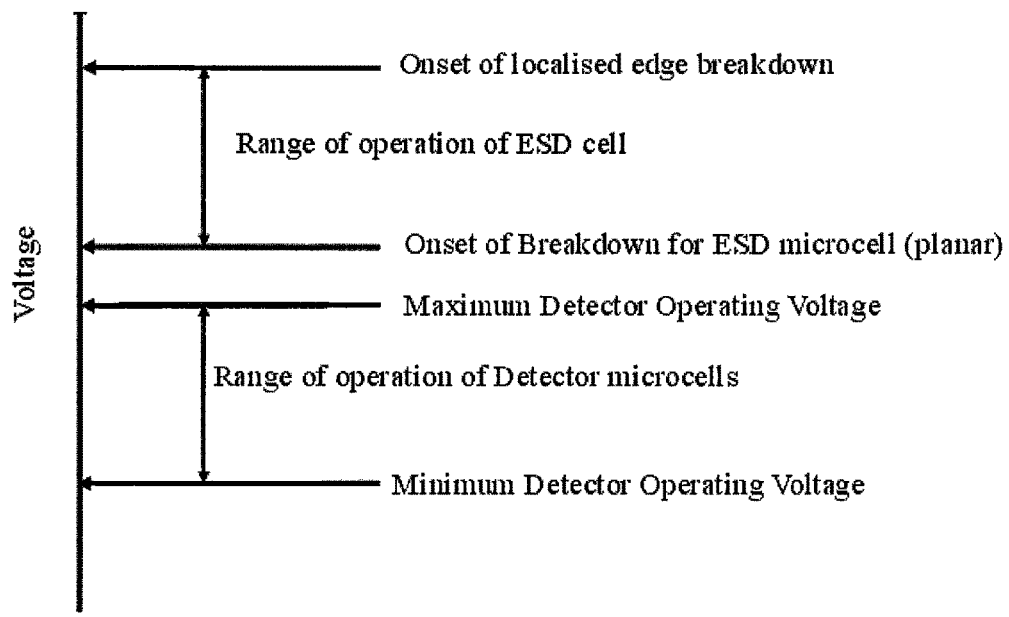
FIG. 16 shows the voltage of the ESD protection diode compared to voltage of photo-detector diode.
Figure 17:
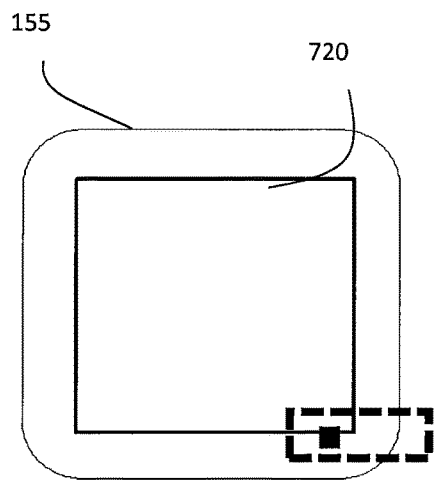
FIG. 17 is an exemplary layout for a photo-detector diode.
Figure 18:
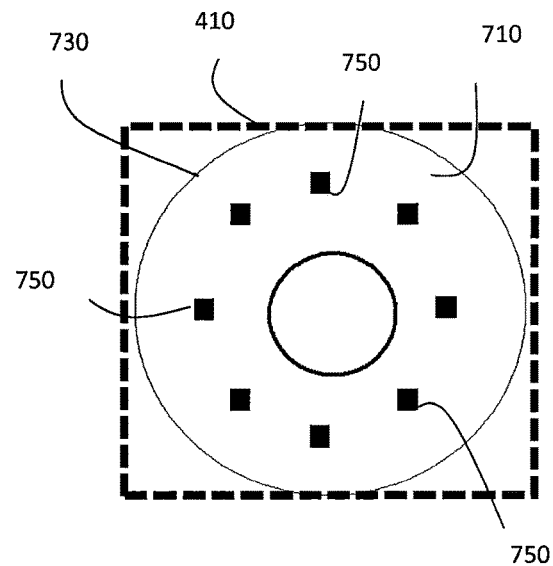
FIG. 18 is an exemplary layout for an ESD protection diode.

As detailed with reference to the negative bias configuration of FIG. 12 the ESD protection diode has the same voltage applied across it as the microcells forming the detector itself which results in distortions to the performance of the detector fast output if the ESD microcells have the same breakdown performance as the detector microcells. To avoid this unwanted behaviour the ESD protection diode 410 may be modified. Its active area 710 may be reduced compared to the active area 720 of the photo-detector diode 155 which has the effect of increasing the voltage at which intrinsic planar breakdown begins as illustrated in FIG. 16. The active area 710 is reduced enough to lift the ESD protection diode 410 1 above the maximum operating voltage of the photo-detector diode 155 itself. Further, the junction 730 defining layer is modified to enhance its curvature in order to increase the voltage at which the ESD protection diode 410 begins to exhibit non-distributed (i.e. localised) edge breakdown at the sensitive Silicon to Silicon Dioxide interface. This opens up an operating window for the ESD protection diode 410 in which it can allow an ESD event to dissipate through it without affecting the detector in normal operation. FIG. 16 provides an illustration of an exemplary operating voltage range of photo-detector diode 155 and ESD protection diode 410. This arrangement allows even the negative biasing scheme to remain unaffected despite the addition of the ESD protection diode. FIG. 17 illustrates a layout of a standard photo-detector diode 155 while FIG. 18 illustrates a layout of an exemplary ESD protection diode 410. The active area 710 of the ESD protection diode has a plurality of contacts/vias 750 evenly distributed for ensuring an ESD event is dissipated efficient to ground.

It will be appreciated by those of ordinary skill in the art that the silicon photomultiplier may be fabricated on the substrate using conventional semiconductor processing techniques and may include for example, but not limited to, deposition, implantation, diffusion, patterning, doping, and etching. Patterned layers of conducting material, insulating material and doped areas of semiconductor form the structure of the microcells. The method of fabrication may include the steps of providing an array of interconnected photosensitive microcells; wherein the array comprises at least a first type of microcell having a first junction region of a first geometric shape; and a second type of microcell having a second junction region of a second geometric shape. At least one ESD protection element may positioned such that it does not receive light. For example, at least one ESD protection element may be covered by an opaque material or an opaque coating. In another example, at least one ESD protection element is covered by a metal material. In the exemplary embodiment, at least one ESD protection element is located beneath a bond pad.

It will be appreciated that the breakdown voltage of the photo-detector diode may be substantially equal to the breakdown voltage associated with the ESD diode. Alternatively, the breakdown voltage of the ESD protection diode is configured to be lower than the breakdown voltage of the photo-detector diodes. In another arrangement, the breakdown voltage of the ESD protection diode is configured to be higher than the breakdown voltage of the photo-detector diodes.

As illustrated in FIG. 18 the active areas of the ESD protection diode is less than the active areas of the photo-detector diodes 155. At least one ESD protection diode is of a first type as illustrated in FIG. 18 while the photo-detector diodes 155 are of a second type as illustrated in FIG. 17. The first type has an active area of a first size; and the second type has an active area of a second size. The first size may be less than the second size. The breakdown voltage of the ESD protection diode 410 may be in the range of 10 Volts to 150 Volts. Alternatively, the breakdown voltage of the ESD protection diode 410 is in the range of 20 Volts to 70 Volts. In another arrangement, the breakdown voltage of the ESD protection diode is in the range of 24 Volts to 40 Volts. The doping profile of the active area of the ESD protection diode 410 may be different to the doping profile of the active area of the photo-detector diode 155 such that the breakdown voltage of the ESD protection diode 410 is higher than the breakdown voltage of the photo-detector diode. Alternatively, the doping profile of the active area of the ESD protection diode 410 is different to the doping profile of the active area of the photo-detector diode 155 such that the breakdown voltage of the ESD protection diode is lower than the breakdown voltage of the photo-detector diode.

The ESD protection diode 410 is ideally located as close as possible to the output pad/terminal. For example, it may be located at or underneath the output pad. Alternatively it could be located between the output pad and the light sensitive SiPM microcells. In one example, it could be located closer to the output pad than the light sensitive SiPM microcells. In another example, in the case of a through silicon via (TSV) type device (where the output pad is located on the underside of the substrate connected to the top active side by the TSVs and bottom side metallization) on the active top side close to one or more of the TSVs and between the TSV and the light sensitive SiPM microcells. Depending on microcell size and SiPM size and type the output pad may be located at a distance of approximately 10 to 50 microns from the active light sensitive SIPM microcells. The ESD protection should be closer the output pad than this minimum distance to try to ensure the charge is dissipated by the ESD protection diode rather than the active microcell.

It will be appreciated by the person of skill in the art that various modifications may be made to the above described embodiments without departing from the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to. The term terminal is intended cover an electrical connection for connecting externally of the device. For example, the anode terminal, cathode terminal, fast output terminal are used for connecting externally of the SiPM device.

Similarly the words comprises/comprising when used in the specification are used to specify the presence of stated features, integers, steps or components but do not preclude the presence or addition of one or more additional features, integers, steps, components or groups thereof.

We claim:

1. A semiconductor photomultiplier comprising:
   one or more microcells on a substrate having at least one terminal, wherein a majority of the microcells are dummy microcells; and
   at least one ESD protection element operably coupled to the at least one terminal, wherein the at least one ESD protection element is not photosensitive.

2. A semiconductor photomultiplier as claimed in claim 1, wherein at least one of the microcells is photosensitive.

3. A semiconductor photomultiplier as claimed in claim 1, wherein a minority of the microcells are photosensitive.

4. A semiconductor photomultiplier as claimed in claim 1, wherein the microcells are arranged in two or more discrete arrays each array having an independent terminal.

5. A semiconductor photomultiplier as claimed in claim 4, wherein each terminal is operably coupled to a corresponding ESD protection element.

6. A semiconductor photomultiplier as claimed in claim 1, wherein each of the at least one ESD protection element is positioned such that it does not receive light.

7. A semiconductor photomultiplier as claimed in claim 1, wherein each of the at least one ESD protection element is covered by an opaque material or an opaque coating.

8. A semiconductor photomultiplier as claimed in claim 1, wherein each of the at least one ESD protection element is covered by a metal material.

9. A semiconductor photomultiplier as claimed in claim 1, wherein each of the at least one ESD protection element is located beneath a bond pad.

10. A semiconductor photomultiplier as claimed in claim 1, wherein each of the at least one ESD protection element is an ESD protection diode.

11. A semiconductor photomultiplier as claimed in claim 1, wherein each of the at least one ESD protection element is coupled to a capacitive load.

12. A semiconductor photomultiplier as claimed in claim 1, wherein two or more ESD protection elements are provided.

13. A semiconductor photomultiplier comprising:
    one or more microcells on a substrate having at least one terminal, wherein at least some of the microcells comprise a photo-detector diode; and
    at least one ESD protection element operably coupled to the at least one terminal, wherein each of the at least one ESD protection element is an ESD protection diode,
    wherein the ESD protection diode is of a first type while the photo-detector diode is of a second type, the first type has an active area of a first size and the second type has an active area of a second size, and the first size is less than the second size.

14. A semiconductor photomultiplier as claimed in claim 13, wherein a breakdown voltage of the photo-detector diode is substantially equal to a breakdown voltage associated with the ESD protection diode.

15. A semiconductor photomultiplier as claimed in claim 13, wherein a breakdown voltage of the ESD protection diode is configured to be lower than a breakdown voltage of the photo-detector diode.

16. A semiconductor photomultiplier as claimed in claim 13, wherein a breakdown voltage of the ESD protection diode is configured to be higher than a breakdown voltage of the photo-detector diode.

17. A semiconductor photomultiplier as claimed in claim 13, wherein active areas of the ESD protection diode is less than the active areas of the photo-detector diode.

18. A semiconductor photomultiplier as claimed in claim 13, wherein the ESD protection diode is an avalanche diode.

19. A semiconductor photomultiplier as claimed in claim 18, wherein the ESD protection diode is operably coupled in series to a resistor.

20. A semiconductor photomultiplier as claimed in claim 13, wherein the ESD protection diode is forward biased.

21. A semiconductor photomultiplier as claimed in claim 13, wherein the ESD protection diode is reversed biased.

22. A semiconductor photomultiplier as claimed in claim 13, wherein a breakdown voltage of the ESD protection diode is in a range of 10 Volts to 150 Volts.

23. A semiconductor photomultiplier as claimed in claim 13, wherein a breakdown voltage of the ESD protection diode is in a range of 20 Volts to 70 Volts.

24. A semiconductor photomultiplier as claimed in claim 13, wherein a breakdown voltage of the ESD protection diode is in a range of 24 Volts to 40 Volts.

25. A semiconductor photomultiplier as claimed in claim 13, wherein the ESD protection diode and the photo-detector diode are of the same type.

26. A semiconductor photomultiplier as claimed in claim 13, wherein the first size is of area such that a breakdown voltage of the ESD protection diode is above the maximum operating voltage of each microcell.

27. A semiconductor photomultiplier as claimed in claim 26, wherein the ESD protection diode has a junction defining an enhanced curvature compared to the junction of the photo-detector diode.

28. A semiconductor photomultiplier as claimed in claim 13, wherein the first size is of area such that a breakdown voltage of the ESD protection diode is below the maximum operating voltage of each microcell.

29. A semiconductor photomultiplier comprising:
one or more microcells on a substrate having at least one terminal, wherein at least some of the microcells comprise a photo-detector diode; and
at least one ESD protection element operably coupled to the at least one terminal, wherein each of the at least one ESD protection element is an ESD protection diode,
wherein a doping profile of an active area of the ESD protection diode is different from a doping profile of an active area of the photo-detector diode such that a breakdown voltage of the ESD protection diode is higher than a breakdown voltage of the photo-detector diode.

30. A semiconductor photomultiplier comprising:
one or more microcells on a substrate having at least one terminal, wherein at least some of the microcells comprise a photo-detector diode; and
at least one ESD protection element operably coupled to the at least one terminal, wherein each of the at least one ESD protection element is an ESD protection diode,
wherein a doping profile of an active area of the ESD protection diode is different to a doping profile of an active area of the photo-detector diode such that a breakdown voltage of the ESD protection diode is lower than a breakdown voltage of the photo-detector diode.

* * * * *